(12) United States Patent
Mainers et al.

(10) Patent No.: US 8,701,737 B2
(45) Date of Patent: Apr. 22, 2014

(54) RETRACTABLE COMPUTER RACK AISLE ROOF

(75) Inventors: Larry D. Mainers, Sandy, UT (US);
Mark J. Goyen, Sandy, UT (US); Vince Lake, Sandy, UT (US)

(73) Assignee: LDM Products, Inc, Draper, UT (US)

( * ) Notice: Subject to any disclaimer, the term of this patent is extended or adjusted under 35 U.S.C. 154(b) by 0 days.

(21) Appl. No.: 12/942,016

(22) Filed: Nov. 8, 2010

(65) Prior Publication Data

US 2011/0108207 A1    May 12, 2011

Related U.S. Application Data

(60) Provisional application No. 61/259,436, filed on Nov. 9, 2009, provisional application No. 61/267,766, filed on Dec. 8, 2009.

(51) Int. Cl.
*E05F 15/20* (2006.01)

(52) U.S. Cl.
USPC .................................... 160/1; 160/313; 52/66

(58) Field of Classification Search
USPC ........ 160/87, 120, 121.1, 1, 23.1, 127, 323.1, 160/311, 241; 52/66
See application file for complete search history.

(56) References Cited

U.S. PATENT DOCUMENTS

| | | | | |
|---|---|---|---|---|
| 1,800,080 A | * | 4/1931 | Kaminski et al. | 160/30 |
| 3,315,727 A | * | 4/1967 | Clark | 160/84.06 |
| 3,466,830 A | * | 9/1969 | Smith | 52/777 |
| 3,747,132 A | | 7/1973 | Foster | |
| 3,815,299 A | * | 6/1974 | Sorensen et al. | 52/66 |
| 4,130,156 A | * | 12/1978 | Wardlaw | 160/9 |
| 4,147,197 A | * | 4/1979 | Bailey et al. | 160/7 |
| 4,231,411 A | * | 11/1980 | Hehl et al. | 160/120 |
| 4,534,277 A | | 8/1985 | Gillmor | |
| 4,596,093 A | | 6/1986 | Esposito | |
| 4,864,783 A | * | 9/1989 | Esposito | 52/86 |
| 4,923,258 A | * | 5/1990 | Styles | 312/115 |
| 5,016,701 A | * | 5/1991 | Vore | 160/241 |
| 5,028,087 A | * | 7/1991 | Ells | 296/24.41 |
| 5,259,812 A | | 11/1993 | Kleinsek | |
| 5,307,856 A | * | 5/1994 | Murray | 160/70 |
| 5,355,927 A | * | 10/1994 | McKeon | 160/7 |

(Continued)

OTHER PUBLICATIONS

International Search Report and Written Opinion of the International Searching Authority for PCT/US2010/056081 dated Jan. 15, 2011. (8 pages).

*Primary Examiner* — Katherine Mitchell
*Assistant Examiner* — Johnnie A Shablack
(74) *Attorney, Agent, or Firm* — Workman Nydegger

(57) ABSTRACT

A roof for a computer rack aisle is provided. The roof has a canopy that may be flexible and/or fire-resistant. The canopy has a retracted position an extended position. In the retracted position, the canopy may be wound around a spool. In the extended position the canopy may cover the top of an aisle between two computer racks. A selectively releasable retainer holds the canopy in the extended position while releasing the canopy to return to the retracted position when a predetermined condition is met. The canopy retractor is provided to return the canopy to a retracted position. The canopy having first and second lateral edges with flanges running from a position approximate a front portion of the canopy and to a position approximate a rear portion of the canopy. The flanges can be received within a canopy guide track to facilitate the smooth movement from the extend position to the retracted position.

21 Claims, 5 Drawing Sheets

(56) References Cited

U.S. PATENT DOCUMENTS

| | | | |
|---|---|---|---|
| 5,542,460 A * | 8/1996 | McKeon | 160/7 |
| 5,544,012 A | 8/1996 | Koike | |
| 5,671,805 A | 9/1997 | Stahl | |
| 5,718,628 A | 2/1998 | Nakazato | |
| 5,963,425 A | 10/1999 | Chrysler | |
| 6,006,476 A * | 12/1999 | Zarnick | 52/6 |
| 6,024,153 A * | 2/2000 | Goldman | 160/61 |
| 6,034,872 A | 3/2000 | Chrysler | |
| 6,034,873 A | 3/2000 | Stahl | |
| 6,088,225 A | 7/2000 | Parry | |
| 6,155,324 A * | 12/2000 | Elliott et al. | 160/1 |
| 6,199,337 B1 * | 3/2001 | Colson et al. | 52/506.06 |
| 6,341,638 B1 * | 1/2002 | Thompson et al. | 160/67 |
| 6,361,011 B1 * | 3/2002 | Brutsaert | 248/316.8 |
| 6,397,618 B1 | 6/2002 | Chu | |
| 6,427,409 B2 * | 8/2002 | Colson et al. | 52/506.08 |
| 6,535,382 B2 | 3/2003 | Bishop | |
| 6,554,697 B1 | 4/2003 | Koplin | |
| 6,574,104 B2 | 6/2003 | Patel | |
| 6,659,530 B1 * | 12/2003 | Jones | 296/98 |
| 6,672,955 B2 * | 1/2004 | Charron | 454/184 |
| 6,681,529 B1 * | 1/2004 | Baloga et al. | 52/29 |
| 6,705,378 B1 * | 3/2004 | Smidt | 160/120 |
| 6,752,193 B1 * | 6/2004 | Molloy | 160/67 |
| 6,775,997 B2 | 8/2004 | Bash | |
| 6,834,512 B2 | 12/2004 | Bash | |
| 6,837,068 B2 | 1/2005 | Wood | |
| 6,843,019 B2 * | 1/2005 | Mercurio et al. | 47/17 |
| 6,859,366 B2 | 2/2005 | Fink | |
| 6,862,179 B2 | 3/2005 | Beitelmal | |
| 6,906,918 B2 | 6/2005 | Rabinovitz | |
| 6,980,433 B2 | 12/2005 | Fink | |
| 7,028,742 B2 * | 4/2006 | Sears et al. | 160/310 |
| 7,104,081 B2 | 9/2006 | Chu | |
| 7,112,131 B2 | 9/2006 | Rasmussen | |
| 7,178,792 B2 * | 2/2007 | Monahan et al. | 256/73 |
| 7,242,162 B2 * | 7/2007 | Goth | 318/480 |
| 7,266,964 B2 | 9/2007 | Vogel | |
| 7,278,273 B1 | 10/2007 | Whitted | |
| 7,281,612 B2 | 10/2007 | Hsieh | |
| 7,330,350 B2 | 2/2008 | Hellriegel | |
| 7,362,571 B2 | 4/2008 | Kelley | |
| 7,430,118 B1 | 9/2008 | Noteboom | |
| 7,438,111 B2 * | 10/2008 | Grimes et al. | 160/23.1 |
| 7,520,091 B2 * | 4/2009 | Friedman | 52/63 |
| 7,568,360 B1 | 8/2009 | Bash | |
| 7,665,506 B2 * | 2/2010 | Coenraets | 160/266 |
| 7,782,625 B2 | 8/2010 | Taylor | |
| 7,841,199 B2 * | 11/2010 | VanGilder et al. | 62/259.2 |
| 7,903,407 B2 | 3/2011 | Matsushima | |
| 8,006,737 B2 * | 8/2011 | Popa | 160/263 |
| 8,016,017 B2 * | 9/2011 | Cloninger et al. | 160/310 |
| 8,037,644 B2 * | 10/2011 | Hall | 52/69 |
| 8,051,866 B2 * | 11/2011 | Cutler | 135/117 |
| 8,184,435 B2 * | 5/2012 | Bean et al. | 361/696 |
| 8,233,270 B2 * | 7/2012 | Pierson et al. | 361/679.02 |
| 8,256,305 B2 * | 9/2012 | Bean et al. | 73/861.75 |
| 8,498,114 B2 | 7/2013 | Martini | |
| 2001/0027846 A1 * | 10/2001 | Osinga | 160/70 |
| 2002/0131242 A1 | 9/2002 | Nagasawa | |
| 2003/0000154 A1 * | 1/2003 | Ignazio | 52/66 |
| 2003/0141025 A1 * | 7/2003 | Schlecht et al. | 160/370.22 |
| 2004/0099778 A1 | 5/2004 | Hogan | |
| 2004/0184232 A1 | 9/2004 | Fink | |
| 2004/0218355 A1 | 11/2004 | Bash | |
| 2004/0244310 A1 | 12/2004 | Blumberg | |
| 2004/0257766 A1 | 12/2004 | Rasmussen | |
| 2005/0045284 A1 * | 3/2005 | Ullyett | 160/238 |
| 2005/0193761 A1 | 9/2005 | Vogel | |
| 2005/0207116 A1 | 9/2005 | Yatskov | |
| 2005/0225936 A1 | 10/2005 | Day | |
| 2005/0237716 A1 | 10/2005 | Chu | |
| 2005/0274463 A1 * | 12/2005 | Becker | 160/98 |
| 2006/0141921 A1 | 6/2006 | Turek | |
| 2007/0017646 A1 * | 1/2007 | Zhao | 160/239 |
| 2007/0064391 A1 | 3/2007 | Lewis | |
| 2007/0284051 A1 * | 12/2007 | Grimes et al. | 160/23.1 |
| 2008/0055850 A1 | 3/2008 | Carlson | |
| 2008/0064317 A1 | 3/2008 | Yates | |
| 2009/0014397 A1 * | 1/2009 | Moss et al. | 211/26.2 |
| 2009/0107652 A1 * | 4/2009 | VanGilder et al. | 165/80.2 |
| 2009/0139663 A1 * | 6/2009 | Cutler | 160/3 |
| 2009/0139668 A1 * | 6/2009 | Naylor | 160/310 |
| 2009/0168345 A1 | 7/2009 | Martini | |
| 2009/0173017 A1 * | 7/2009 | Hall | 52/69 |
| 2010/0024992 A1 * | 2/2010 | Cloninger et al. | 160/311 |
| 2010/0108272 A1 * | 5/2010 | Karidis | 160/238 |
| 2010/0144265 A1 | 6/2010 | Bednarcik et al. | |
| 2010/0230058 A1 * | 9/2010 | Mahoney | 160/331 |
| 2010/0243175 A1 * | 9/2010 | Gonzales et al. | 160/7 |
| 2010/0305760 A1 * | 12/2010 | Schoen | 700/275 |
| 2011/0198041 A1 * | 8/2011 | Svirsky et al. | 160/61 |
| 2011/0203750 A1 * | 8/2011 | Cloninger et al. | 160/313 |
| 2011/0271610 A1 | 11/2011 | Cottuli et al. | |
| 2012/0006038 A1 | 1/2012 | Sharma | |
| 2012/0043029 A1 * | 2/2012 | Gaskill et al. | 160/121.1 |

\* cited by examiner

RETRACTABLE COMPUTER RACK AISLE ROOF

RELATED APPLICATIONS

This patent application claims benefit of and priority to U.S. provisional patent application Ser. No. 61/259,436 entitled "RETRACTABLE AIR CONTAINMENT COMPUTER AISLE RACK ROOF" filed on Nov. 9, 2009 and U.S. provisional patent application Ser. No. 61/267,766 entitled "RETRACTABLE AIR CONTAINMENT COMPUTER AISLE PARTITION" filed on Dec. 8, 2009 which are incorporated in their entirety by reference and made a part hereof.

BACKGROUND OF THE INVENTION

1. Field of the Invention

The invention relates to air containment systems for computer server racks. In particular the invention relates to a containment roof for computer server racks.

2. State of the Art

Many companies have data centers either for the company's use or for selling data services to others. Frequently many computers are pooled into clusters and placed in many racks. These racks may be placed in rows within the data center. The electronic equipment in the data centers includes servers, computers, routers and the like. They may also include backup servers, which can take over the function of primary servers in the event of a primary server failure. They are typically co-located with the network switches and/or routers which enable communication between the different parts of the cluster and the users of the cluster. The computers, routers, power supplies, and related electronics are typically mounted on 19-inch racks in a server room or data center.

All computer equipment produces heat when it is in operation. For this purpose, a fan is typically installed in the computer. The fan draws cooler air from the environment over the heated internal parts. Heated air is exhausted back into the environment. In large data centers, the heat from many computers results in significant heating of the data center environment. Many large air conditioning units are used to cool the data center environment.

To reduce the cost of cooling data centers, the computer racks can be arranged in rows with the equipment in adjoining rows. The computers in the racks are situated so that hot and cool aisles are created. In the hot aisle the fans on the equipment in adjoining rows exhausts the heated air form the equipment. In the cool aisle, conditioned air is draw into and cools the equipment.

Containment devices such as doors, roofs, as well as vertical curtains are used to contain the conditioned air within the cool row. In this way the heated air and conditioned air do not mix maximizing the cooling effect on the equipment while keeping the costs of cooling down.

Most fire codes and best practices require that at least the roofs of the containment systems be configured to allow fire suppression systems to spray within the contained aisle in the event of fire.

Most of the roofs of available containment systems use a series of panels that separate when a fire is detected. These panels may drop to the floor potentially striking persons in the data center or a firefighter with debris. Further the fallen panels create a tripping hazard as persons attempt to leave the building and as firefighters attempt to clear the building and/or suppress the fire.

BRIEF SUMMARY OF THE INVENTION

An air containment system for separating conditioned air from the heated exhaust of a computer rack aisle is presented. The containment system may include a roof system with retractable canopy. The retractable canopy has a retracted position and an extended position. A retractor may transition the canopy from the extended position to a retracted position. In the extended position, the canopy may cover at least a portion of the top of the computer rack aisle, and in the retracted position the canopy may be substantially removed from above the computer rack aisle.

A selectively releasable retainer may retain the canopy in the extended position. When the environment in which the computer rack aisle is located is exposed to a predetermined condition, the retainer may release the canopy to return to the retracted position. Such predetermined conditions may include a fire, excessive heat, failure of the air conditioning system, or other condition that may result in damage to electronic equipment that may be stored within the computer racks. The predetermined condition may be an environmental temperature in the range from about 90° F. to about 225° F. In certain embodiments, the predetermined condition may be an environmental temperature in the range from about 115° F. to about 145° F. In yet other embodiments, the predetermined condition may be an environmental temperature of about 135° F.

The rack roof may have a have a heat sensitive retainer such as a fusible link, such as a mechanical fusible link, a mechanical fusible chain, a mechanical fusible wire, and an electrically actuated fusible link. The selectively releasable retainer may also be an electronically actuated retainer that selectively retains or releases the canopy based on a signal received from a sensor, a fire suppression system, human input, or the like.

The canopy may be a flexible tarp made of a material such as vinyl, plastic, cotton, wool, poly vinyl chloride other natural and synthetic materials, or a combination thereof. The canopy may be fire resistant.

The canopy may have first and second lateral sides. One or more flanges may be attached to or made an integral part of the canopy. Generally such flanges run along or near the first and/or second lateral sides from a position near a front end of the canopy to a position near or near the rear end of the canopy. By way of example and not limitation, the flanges may be constructed of a flexible plastic, rubber, aluminum or like materials attached to or near the side of the canopy. Alternatively, the flange may be an integral part of the canopy molded in the canopy material or rolled or enclosed within the first and or second lateral edges of the canopy. A canopy guide track may be provided to be attached along the top portion of the computer racks. The canopy guide track may have a channel configured to receive therein the one or more flanges. Likewise the flanges may be configured to be received within channel of the track.

A variety of canopy retractors may be employed within the present invention. For example, in certain embodiments, the canopy may be connected to a spool configured to receive the canopy thereon. Such spools can be operably connected to a retracting spring or a motor. The retracting spring or motor can be configured to retrieve the canopy from the extended position to the retracted position when the selective retainer is exposed to the predetermined environmental condition. When a retracting spring is used, the spring may bias the canopy toward the retracted position. When a motor is used the motor may be activated to retrieve the canopy from the extended position to the retracted when the selective retainer is exposed to the predetermined environment condition. In such embodiments, a selective retainer may be the unactivated motor.

The canopy has a length that will vary depending on the length of the racks on which it is deployed. In some embodiments, the canopy has a length in the range from about 8 feet to about 50 feet. In certain other embodiments the canopy has a length in the range from about 14 feet to about 30 feet.

Additionally the width of the canopy should adequately cover the rack aisle. The canopy may have a width in the range from about 3 feet to about 8 feet. In other configurations, the canopy may have a width in the range from about 4 feet to about 7 feet.

The present invention also relates to an air containment system for a computer rack aisle. Such containment systems may have one, two, or more canopy systems. The canopy system may include a canopy, having an extended position and a retracted position. A canopy retractor can move the canopy from the extended position to the retracted position. A selectively releasable retainer can retain the canopy in the extended position release the canopy from the extended position when a predetermined condition is met.

When two or more canopies are used, they be releasable joined along at least one side of the canopies when the canopies are in the extended position. The air containment system may have canopies that are deployable in a substantially horizontal orientation or a substantially vertical orientation.

DETAILED DESCRIPTION OF THE INVENTION

Figure 1:
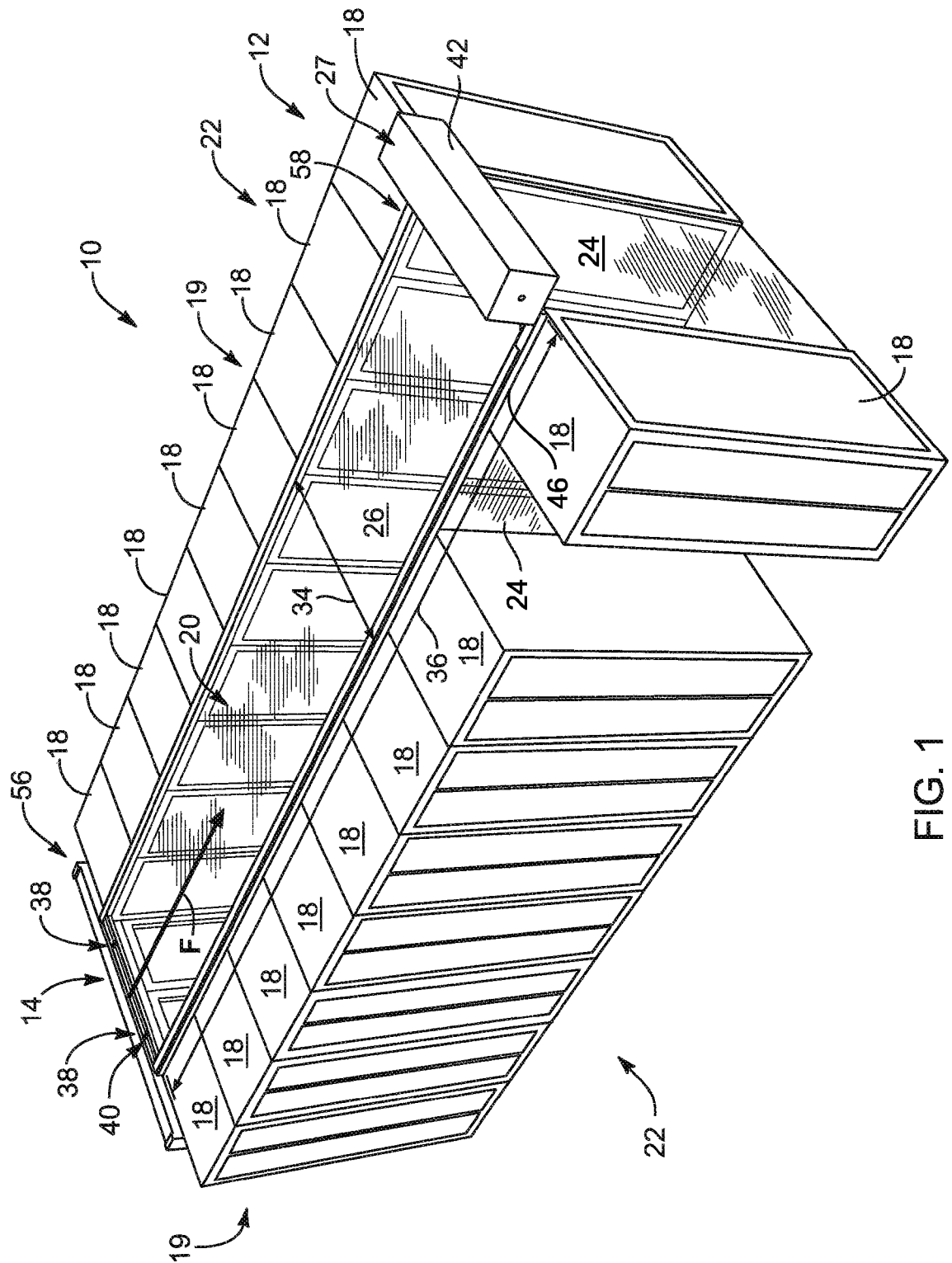
FIG. 1 is a perspective view of a computer rack aisle having a retractable roof system according to the present invention.

Before the present system and methods of use thereof for producing an accurate likeness are disclosed and described, it is to be understood that this invention is not limited to the particular configurations, process steps, and materials disclosed herein as such configurations, process steps, and materials may vary somewhat. It is also to be understood that the terminology employed herein is used for the purpose of describing particular embodiments only and is not intended to be limiting since the scope of the present invention will be determined by the appended claims and equivalents thereof.

As used herein, "comprising," "including," "containing," "having," "characterized by," and grammatical equivalents thereof are inclusive or open-ended terms that do not exclude additional, unrecited elements or method acts.

As used herein, "about" means reasonably close to, a little more or less than the stated number or amount, or approximately.

As used herein, "exemplary" means serving as an example of. The use of the term "exemplary" herein in connection with a particular embodiment is not to be construed as the particular embodiment being preferred over any other embodiment.

Referring to FIGS. 1-5 exemplary embodiments of a computer aisle air containment system 10 having a computer aisle roof system 12 in accordance with the present invention is shown.

The air containment system 10 can be used in computer data centers where electronic equipment (not shown) such as computers, servers, routers, etc., is located in many server racks 18. The electronic equipment produces a large amount of heat that must be expelled from the equipment to prevent damage to the equipment and potentially a fire. To cool the equipment, small electric fans are generally placed inside the equipment. The fans draw cooler air from the environment through the equipment. This air cools the equipment and is discharged as heated air back into the environment.

When large amounts of electronic equipment are located in a data center, the collective heat produced by the pooled equipment can rapidly heat the room in which it is located. To keep the room and the equipment cool, a cooling system is provided to the room.

However, cooling the entire room is inefficient. Therefore, containment systems have been used that isolate the heated exhaust air from the conditioned cooler air. Such containment systems may create a cool aisle 20 where conditioned air is supplied through the floor or otherwise supplied and a hot aisle 22 where the heated exhaust air is discharged from the electronic equipment and may be vented from the building. The racks 18 and the computer equipment therein create walls for the cooled aisle 20. End caps such as door unit 14 and/or curtain 24 contain the conditioned air within the cooled aisle 20. A roof system 12 can be employed to contain the conditioned air within the cooled aisle. It will be appreciated, that while the current practice is to contain cooled air within the cooled aisle 20, the racks 18 and equipment could be rearranged so that the hot air is contained within the aisle and the cooled air is the environmental air external to the aisle.

The present invention includes a roof system 12 with a retractable canopy 26. The canopy 26 can flexible so that it is able to be wound around a spool 28 (FIG. 3) or otherwise retracted by a retractor. The canopy 26 may be constructed of natural or man-made materials. Such materials may include, but are not limited to cotton, wool, plastic, vinyl, nylon, polyester, polyvinyl chloride, polycarbonate, etc. The material selected for the canopy 26 can be fire retardant. Additionally a transparent or translucent canopy 26 can allow the light from the data center room to filter into the cool aisle 20.

The retractable canopy 26 has an extended position wherein at least a portion of the canopy 26 covers the space above the cool aisle 20 and a retracted position wherein the canopy 26 is substantially removed from above the cool aisle 20. The canopy 26 can have reinforcements 44 (FIG. 2A) applied to its front end 56 distal from the retractor. Such reinforcements can be one or more folds in the canopy 26 or may include metal, wood, paper, plastic, other materials, etc. that serve to strengthen the front end 56.

The canopy has a length 36 that will vary depending on the length of the racks aisle 19 on which it is deployed. In some embodiments, the canopy has a length 36 in the range from about 8 feet to about 50 feet. In certain other embodiments the canopy has a length 36 in the range from about 14 feet to about 30 feet. In a present embodiment the canopy has length of about 20 feet. For longer aisles two or more canopies 26 and retractors 27 can be used.

Additionally the width 34 of the canopy should adequately cover the rack aisle 19. The canopy may have a width 34 in the range from about 3 feet to about 8 feet. In other configurations, the canopy 26 may have a width 34 in the range from about 4 feet to about 7 feet. In a present embodiment the canopy has a width 34 of about 6½ feet.

If a rack aisle has missing racks 18 or racks that are shorter than other racks, curtains 24 can be hung from the rail 46 to cover the opening. These curtains may be made from the same or similar materials as the canopy 26.

Figure 2A:
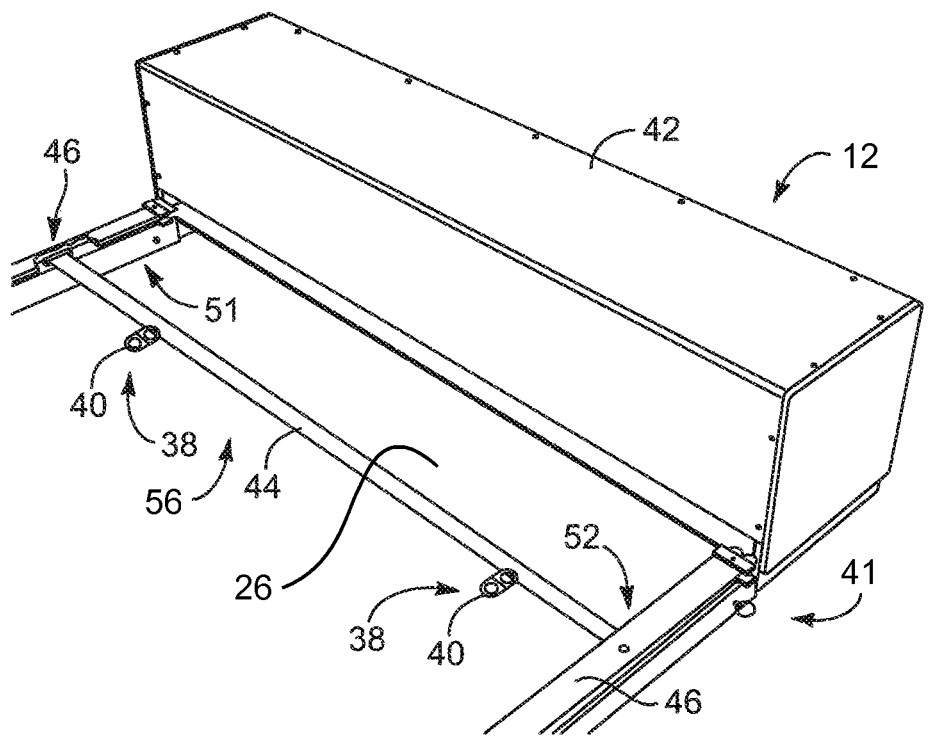
FIG. 2A is a perspective view of a first portion of a computer rack aisle roof system in accordance with the present invention.

The spool 28 can be a spring loaded spool that biases the canopy toward the retracted positioned as shown in FIG. 2A. Referring to FIG. 3 with continued reference to FIGS. 1 and 2, a simplified spring loaded spool 28 that may be used with the present invention is presented. The spool 28 has an inner spool 60 that is operably linked to a spring 62. The spring 62 is also operably linked to an outer spool 64. The canopy 26 is attached to and wound around outer spool 64. The canopy may be attached to the outer spool 64 with fasteners such as screws or rivets or may be inserted into a groove within the outer spool 64 configured to receive and capture the canopy 26. As the canopy 26 is pulled from the retracted position (FIG. 2A) into the extended position (FIG. 1), the spring 62 is placed under tension. This tension creates a force F that continually biases the canopy 26 to the retracted position 32. When the selectively releasable retainers 38 (FIG. 2A) release the canopy, the spring 62 turns the outer spool 64 and retracts the canopy 26.

Selectively releasable retainers 38 can be used to selectively hold the canopy 26 in the extended position. The retainers 38 can be configured to release the canopy 26 to retract to the retracted position when a predetermined condition is met. The selectively releasable retainers may be a fusible link 40 such as mechanical fusible link, a mechanical fusible chain, a mechanical fusible wire, and an electrically actuated fusible link.

The predetermined condition under which the selective retainers 38 release the canopy may vary depending on the reason for the release. For example, the retainer 38 may be selected to release the canopy when the predetermined condition is the detection of a fire. The fire suppression system can send a signal to an electrically actuated fusible link or other electronic retainer 38 to release the retainer to the retracted position. The preselected condition can also be the failure of a cooling system. Additionally, the temperature of the environment may indicate the presence of a fire or the catastrophic failure of the cooling system. The predetermined condition can be an environmental temperature in the range from about 90° F. to about 225° F. In other embodiments, the predetermined condition can be an environmental temperature in the range from about 115° to about 145° F. In yet other embodiments the predetermined condition is an environmental temperature of about 135° F.

Figure 2B:
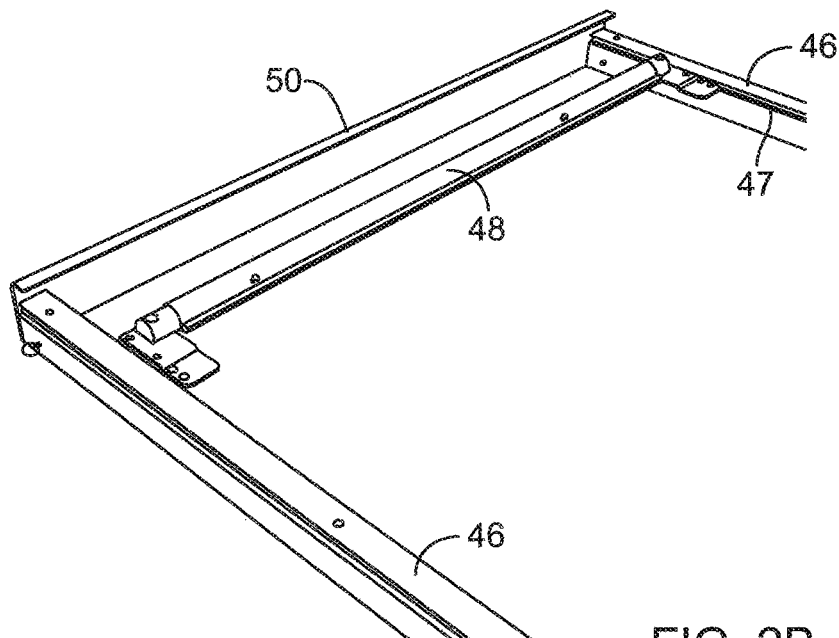
FIG. 2B is a perspective view of a second portion of a computer rack aisle roof system in accordance with the present invention.
Figure 3:
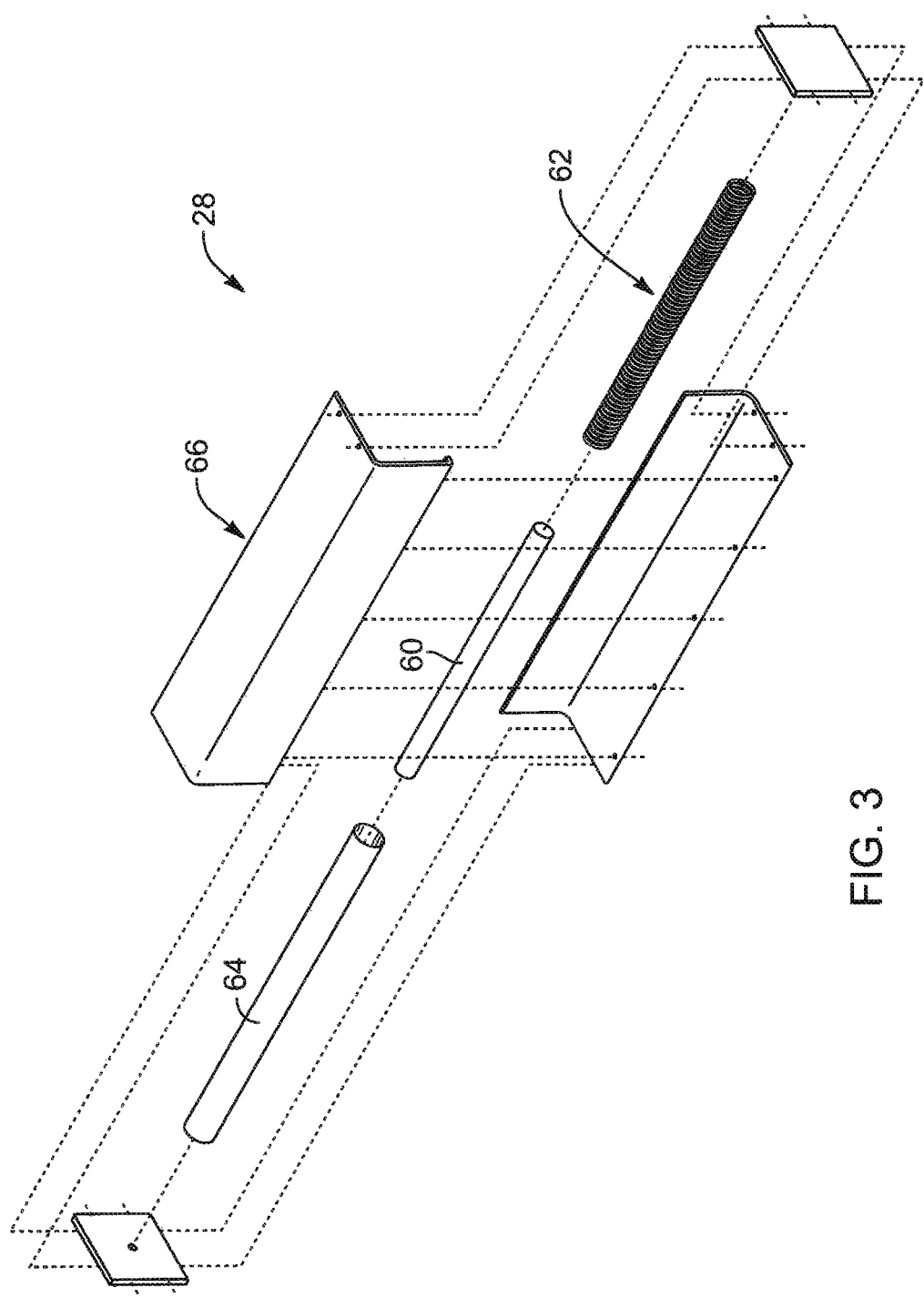
FIG. 3 is an exploded view of a retractable canopy in accordance with the present invention.

With reference to FIGS. 2A and 2B, the roof system 12 can include a rack assembly 41 for attaching the roof system 12 to the rack aisle 19. The rack assembly 41 can include housing 42 that covers the spool 28 (FIG. 3) and the refracted canopy 26. The housing 42 may be mounted to an end of the computer rack aisle 19. The assembly 41 can also include side rails 46 to provide lateral support to the assembly 41. Aisle cross supports 50 may be provided distally from the housing 42 near the front portion 56 (FIG. 1) of the rack assembly 41 or at any desired intervals internal to the rack assembly 41. End support 48 can provide additional stability to the rack assembly and provide for an attachment point for the selectively releasable retainers 38.

The rails 46 can include channels 47. The channels 47 can be configured to receive edges 51 of the canopy 26 to guide the canopy from the extended position 30 to the refracted position 32 or vice versa. Additionally, the canopy 26 may include flanges 52 that run from a position approximate a front portion 56 of the canopy 26 and to a position approximate a rear portion 58 of the canopy. The flanges 52 can hold the canopy edges 51 within the channels 47. The side rails 46 can be relatively air tight on top of the racks 18. The rails 46 may incorporate adjustable standoffs for some applications.

The housing 42 can be used to cover the retractor 27 and spool assembly 28. Housing 42 made from aluminum or other fire retardant materials can protect the retractor and spool assembly while giving added fire resistance to a retracted canopy 26.

Figure 4:
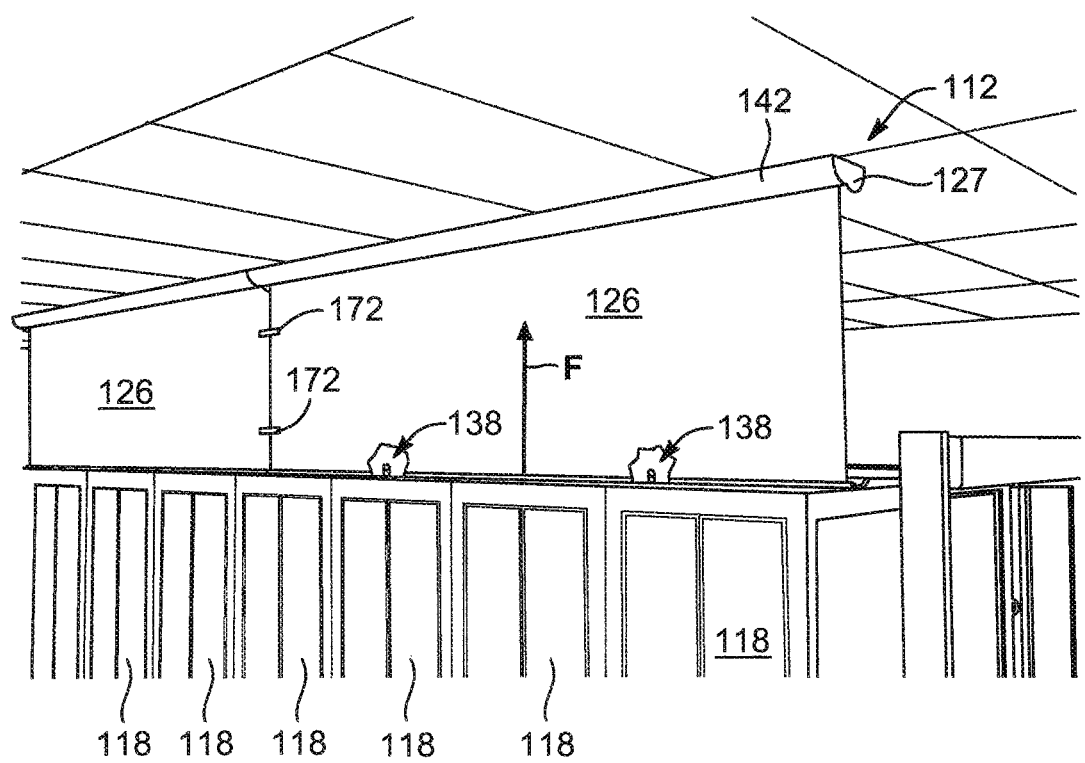
FIG. 4 is a perspective view of an additional embodiment of an air containment system in accordance with the present invention.

Referring now to FIG. 4 an alternative embodiment of a roof system 112 is shown. In this embodiment, the canopy 126 is deployed in a substantially vertical position. Retractor 127 is mounted to the ceiling of the room in which the racks 118 are located. Alternatively the retractor 127 can be mounted to the top of the racks 118. The when the canopy 126 is extended, it is connected to the top of the rack 118 or ceiling by selectively releasable retainers 138, 142 as previously discussed. When the retainers 138, 142 release the canopy 126, canopy 126 is retraced by force F into the housing 142. One or more additional canopies 126 may be operably connected to additional retractors 127. These multiple canopies along with the ceiling of the room, may serve as the roof unit of the air containment system. To further secure the air within the containment system, releasable fasteners 172 can be used to secure the edges of adjoining canopies 126. Such fasteners 172 can be hook and latch fabric fasteners, magnets, fusible links, or the like.

Figure 5:
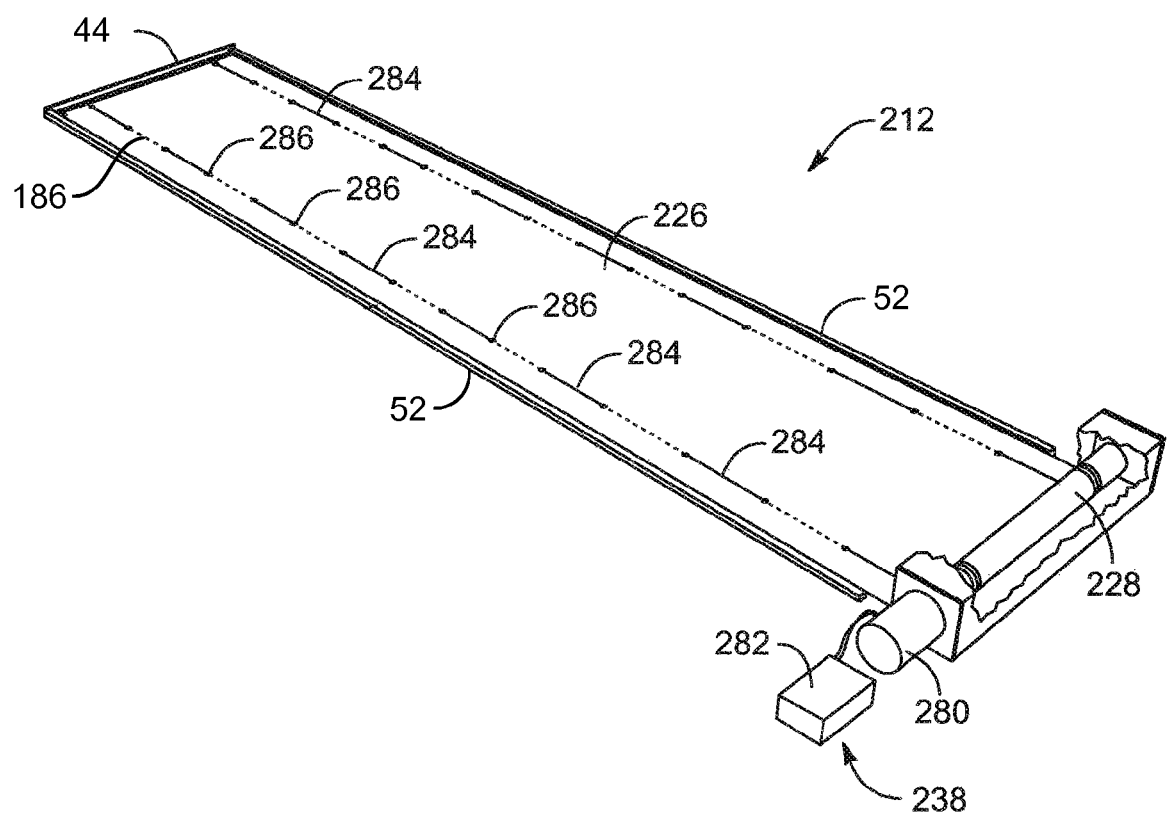
FIG. 5 is an additional embodiment of a retractable roof rack canopy in accordance with the present invention.

Referring now to FIG. 5 an alternative embodiment of a roof system 212 is shown. The roof system uses a canopy 226 and selectively releasable retainers 238 as discussed with FIG. 1. In this embodiment electric motor 280 is connected to spool 228 and power supply 282. When motor 280 is used retainers 238 may also be the motor or an impulse to the motor. Power supply 282 can be a battery or the motor may be plugged into an outlet.

Spool 228 is operably linked to cord 284. The distal end of the cord 284 is connected to the distal end of the canopy 226 and woven through the canopy through reinforced holes 186. When the motor is activated in the event of a predetermined condition, the chord is wound around spool 228. The retracting cord 286 pulls the canopy 226 into a retracted position.

The invention claimed is:
1. A computer rack air containment system comprising:
  a first row of computer racks housing electrical computer equipment;
  a second row of computer racks housing electrical computer equipment, the second row being spaced apart from the first row so that an aisle is formed therebetween, the aisle having a first end and an opposing second end;
  a canopy disposed in an extended position so that the canopy spans completely across the aisle and extends from the first end of the aisle to the opposing second end of the aisle, the canopy being movably secured to the first row of computer racks and the second row of computer racks; and
  a canopy retractor secured to the canopy and disposed at the first end of the aisle, the canopy retractor being configured to move the canopy from the extended position to a retracted position;
  a selectively releasable retainer securing a front portion of the canopy at the second end of the aisle, the releasable retainer being configured to release the canopy so that the canopy can move to the retracted position when a predetermined condition is met.
2. The computer rack air containment system of claim 1, wherein the canopy is fire-resistant.

3. The computer rack air containment system of claim 1, wherein the canopy has a length in the range from about 8 feet to about 50 feet.

4. The computer rack air containment system of claim 1, wherein the canopy has a width in the range from about 3 feet to about 8 feet.

5. The computer rack air containment system of claim 1, wherein the canopy that extends from the first end of the aisle to the opposing second end of the aisle is substantially horizontally disposed.

6. The computer rack air containment system of claim 1, wherein the canopy comprises a flat sheet of material that is sufficiently flexible that it can be wound around a spool.

7. The computer rack air containment system of claim 1, wherein the canopy has first and second lateral edges, the first and second lateral edges having a flange running from a position approximate a front portion of the canopy and to a position approximate a rear portion of the canopy.

8. The computer rack air containment system of claim 7, further comprising a first canopy guide track extending along the first row of computer racks and a second canopy guide rack extending along the second row of computer racks, the flange on the first lateral edge of the canopy being retained within the first canopy guide rack and the flange on the second lateral edge of the canopy being retained within the second canopy guide rack.

9. The computer rack air containment system of claim 1, wherein the selectively releasable retainer is a heat sensitive retainer.

10. The computer rack air containment system of claim 9, wherein the predetermined condition is an environmental temperature in the range from about 90° F. to about 225° F.

11. The computer rack air containment system of claim 9, wherein the heat sensitive retainer is a fusible link.

12. The computer rack air containment system of claim 11, wherein the fusible link is selected from the group consisting of a mechanical fusible link, a mechanical fusible chain, a mechanical fusible wire, and an electrically actuated fusible link.

13. The computer rack air containment system of claim 1, wherein the canopy retractor comprises a spool receiving the canopy thereon.

14. The computer rack air containment system of claim 13, wherein canopy retractor further comprises a retracting spring or a motor.

15. The computer rack air containment system of claim 14, wherein the canopy is substantially wound around the spool when in the retracted position and wherein the retracting spring is configured to bias the canopy toward the retracted position.

16. A computer rack air containment system comprising:
a first row of computer racks housing electrical computer equipment, the first row of computer racks having a first end and an opposing second end;
a second row of computer racks housing electrical computer equipment, the second row being spaced apart from the first row in substantially parallel alignment so that an aisle if formed therebetween, the second row of computer racks having a first end and an opposing second end;
a first canopy guide track and a second canopy guide track secured to and extending along the first row of computer racks at least partially between the first end and the second end thereof and the second row of computer racks at least partially between the first end and the second end thereof, respectively;
a canopy retractor at least partially disposed between the first ends of the first and second rows of computer racks; and
a canopy having a first end an opposing second end with opposing side edges extending therebetween, the first end of the canopy being secured to the canopy retractor, the opposing side edges of the canopy being slidably retained within corresponding ones of the first and second canopy guide tracks, the canopy reactor being configured to move the canopy between an extended position and a the canopy between an extended position and a retracted position;
a selectively releasable retainer securing a front portion of the canopy at the second end of the aisle, the releasable retainer being configured to release the canopy so that the canopy can move to the retracted position when a predetermined condition is met.

17. The computer rack air containment system of claim 16, wherein at least a portion of the canopy extends from the first end of the aisle to the opposing second end of the aisle when in the extended position and that portion of the canopy is substantially horizontally disposed.

18. A computer rack air containment system comprising:
a first row of computer racks housing electrical computer equipment, the first row of computer racks having a top surface that extends from a first end to an opposing second end;
a second row of computer racks housing electrical computer equipment, the second row being spaced apart from the first row in substantially parallel alignment so that an aisle if formed therebetween that extends between a first end and an opposing second end, the second row of computer racks having a top surface that extends from a first end to an opposing second end;
a first canopy guide track extending along the top surface of the first row at least partially between the first end and the opposing second end thereof;
a second canopy guide track extending along the top surface of the second row at least partially between the first end and the opposing second end thereof;
a canopy retractor extending between the top surface of the first row and the top surface of the second row at the second end of the aisle;
an elongated canopy comprised of a flexible sheet having a first end an opposing second end with opposing side edges extending therebetween, the canopy being disposed in an extended position with the first end of the canopy being secured at the first end of the aisle by a releasable retainer, the opposing side edges of the canopy being slidably retained within corresponding ones of the first and second canopy guide tracks so that at least a portion of the canopy horizontally spans across the aisle, and the second end of the canopy is secured to the canopy retractor, the canopy reactor applying a resilient spring force on the canopy so that when the releasable retainer releases the first end of the canopy, the canopy automatically retracts toward the canopy retractor.

19. The computer rack air containment system of claim 18, wherein the releasable retainer is a heat sensitive retainer that releases the first end of the canopy when a predetermined temperature is reached.

20. The computer rack air containment system of claim 19, wherein the heat sensitive retainer is a fusible link.

21. The computer rack air containment system of claim 18, wherein the canopy retractor comprises a spool about which the canopy is wound when releasable retainer releases the first end of the canopy.

* * * * *

UNITED STATES PATENT AND TRADEMARK OFFICE
CERTIFICATE OF CORRECTION

| | | |
|---|---|---|
| PATENT NO. | : 8,701,737 B2 | Page 1 of 2 |
| APPLICATION NO. | : 12/942016 | |
| DATED | : April 22, 2014 | |
| INVENTOR(S) | : Mainers et al. | |

It is certified that error appears in the above-identified patent and that said Letters Patent is hereby corrected as shown below:

Title Page 1 Left-hand Column, under Item (75)
Lines 2-3, change inventors' names from "Mark J. Goyen" and "Vince Lake" to --Mark A. Goyen-- and --Vincet Michael Lake--

Title Page 1 Right-hand Column, under Item (57)
Line 3, change "an extended position" to --and extended position--
Line 15, change "extend position" to --extended position--

In the Drawings
Sheet 3, replace Figure 3 with the figure depicted below, wherein the reference number 66 is changed to 26

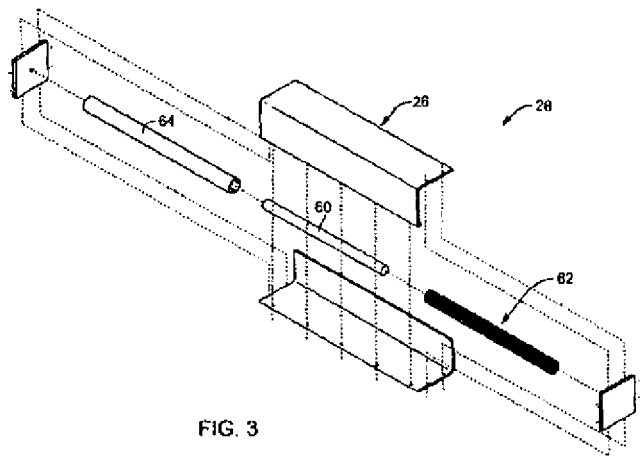

In the Specification
Column 2
Line 24, change "have a have" to --have--

Signed and Sealed this
Nineteenth Day of August, 2014

Michelle K. Lee
*Deputy Director of the United States Patent and Trademark Office*

CERTIFICATE OF CORRECTION (continued)
U.S. Pat. No. 8,701,737 B2

Line 32, change "poly vinyl chloride other" to --polyvinyl chloride, other--
Line 49, change "within channel" to --within a channel--

Column 3
Line 16, change "position release" to --position and release--
Line 66, change "invention is" to --invention are--

Column 4
Line 34, change "can flexible" to --can be flexible--

Column 5
Line 18, change "position 32" to --position.--
Line 62, change "position 30" to --position--
Line 63, change "position 32" to --position--

Column 6
Line 14, change "The when" to --Then when--

In the Claims
Column 8
Line 13, change "position;" to --position; and--
Line 33, change "if formed" to --is formed--